United States Patent [19]

Gross et al.

[11] Patent Number: 4,499,432

[45] Date of Patent: Feb. 12, 1985

[54] LOW VOLTAGE OP AMP BIAS OPTIMIZER

[75] Inventors: William H. Gross; Tadashi Sakurai, both of Tokyo, Japan

[73] Assignee: National Semiconductor Corporation, Santa Clara, Calif.

[21] Appl. No.: 439,001

[22] Filed: Nov. 4, 1982

[51] Int. Cl.³ ............................................. H03F 3/04
[52] U.S. Cl. .................................. 330/296; 330/156; 330/288
[58] Field of Search ...................... 330/156, 288, 296; 323/315, 316

[56] References Cited

U.S. PATENT DOCUMENTS 4,374,335  2/1983  Fukahori et al. ................... 330/257

Primary Examiner—James B. Mullins
Assistant Examiner—G. Wan
Attorney, Agent, or Firm—Gail W. Woodward; Paul J. Winters; Michael J. Pollock

[57] ABSTRACT

An operational power amplifier having a bootstrap power output stage is designed to provide maximum dynamic range over a wide range of supply voltages. A control circuit in the form of a switched current mirror is added to the amplifier biasing circuit. At supply voltage higher than a predetermined threshold, the amplifier bias is adjusted to provide one half of this voltage at the output terminal. For supply voltages less than the threshold value, the output voltage is made less than half supply voltage.

6 Claims, 3 Drawing Figures

U.S. Patent  Feb. 12, 1985  4,499,432
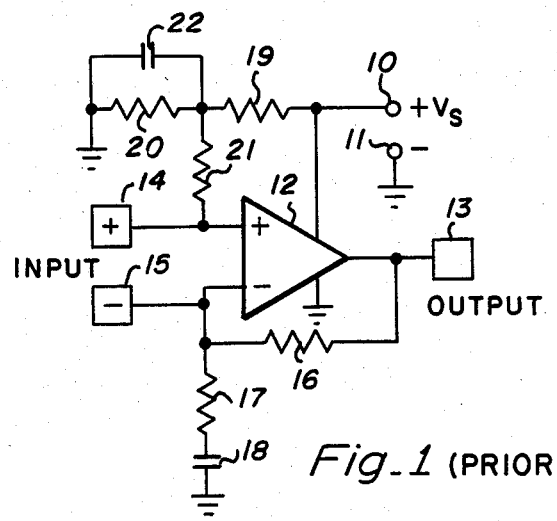
Fig_1 (PRIOR ART)
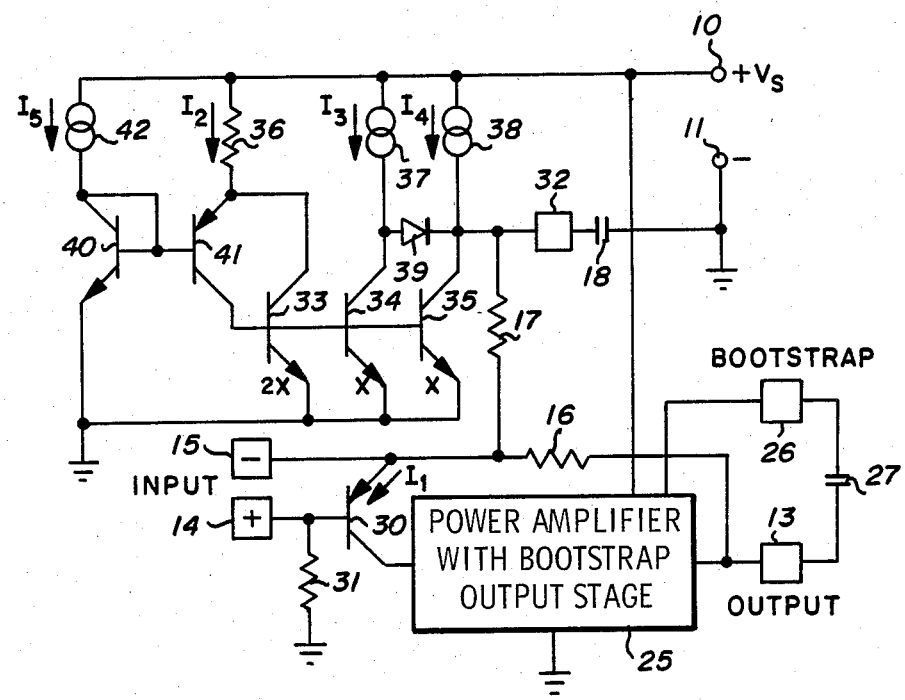
Fig_2
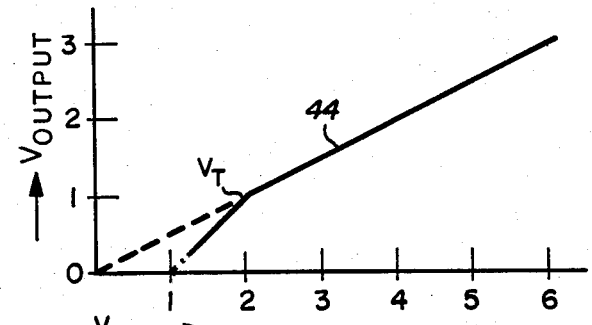
Fig_3

LOW VOLTAGE OP AMP BIAS OPTIMIZER

BACKGROUND OF THE INVENTION

Operational amplifiers (op amps) are often called upon to operate over a wide range of supply voltages. This can range from the typical 1.5 volts for a nearly discharged pair of carbon-zinc battery cells to many volts supplied from a plural cell battery. Efficient operation of such amplifiers commonly entails the use of a bootstrap output stage in which the output driver stage operating voltage is boosted my means of a feedback capacitor. This is done to enhance the drive to the output stage using circuitry that is well known in the art. At the higher operating supply voltages it is desirable for the d-c level of the output stage to operate at one half of the supply voltage. FIG. 1 of the drawing shows a commonly used biasing circuit. $V_s$ represents a supply voltage source connected between + terminal 10 and − terminal 11 which is grounded. Op amp 12 has an output terminal 13 which may be coupled to a loudspeaker or some other form of transducer (not shown). Inverting input 15 is directly coupled via resistor 16 to the output terminal 13 so that the amplifier has unity d-c gain. Resistor 17, which is bypassed to ground for signal frequencies by capacitor 18, reduces the a-c feedback and therefore determines the amplifier signal gain. Resistors 19 and 20 are typically of equal value and are coupled across $V_s$ so as to develop $\frac{1}{2} V_s$ at their juncture which is signal bypassed to ground by capacitor 22. Resistor 21 couples this voltage as a d-c bias to noninverting op amp input 14. This arrangement will make sure that the output operates at a d-c level equal to $V_s/2$.

This circuit is commonly used but suffers a basic drawback when the bootstrap output stage is employed. For such an amplifier it has been found that below a critical supply voltage the $V_s/2$ relationship is not desirable. For best overall performance below a critical or threshold supply voltage, the bias voltage should decrease more rapidly than $V_s/2$. One commonly used method for achieving this is to include forwardly biased diodes in the bias circuit in a series parallel combination that causes the bias voltage to decrease faster than $V_s/2$ below some threshold value. We have discovered that such diode biasing is limited to a threshold value of greater than 3 volts. We have further discovered that a threshold of just over 2 volts is desirable for many battery operated bootstrap amplifiers.

SUMMARY OF THE INVENTION

It is an object of the invention to provide an amplifier biasing circuit in which the output tracks $V_s/2$ for supply voltages above a predetermined threshold and falls at a faster rate below a threshold which is under three volts.

It is a further object of the invention to establish a bias threshold of about 2 volts for an op amp above which the bias is a function of $V_s/2$ and below which the bias falls at a rate that is steeper than $V_s/2$.

It is a still further object of the invention to employ a ratioed current mirror with diode switching between a pair of outputs to bias a bootstrap output amplifier whereby a threshold ($V_T$) is established above which the amplifier d-c output is equal to $V_s/2$ and below which the output is equal to $V_s - K$ where K is a constant.

These and other objects are established using the following circuit combination. An op amp with a bootstrap power output stage is designed to operate at very low current in the absence of signal. The input stage includes a low current PNP transistor in which the base and emitter electrodes provide the noninverting and inverting inputs respectively. The base is returned to ground through a resistor and acts as the noninverting input. The emitter or inverting input is offset at $V_{BE}$ above ground. The amplifier d-c output is fed back to the inverting input by way of a resistor which provides unity d-c overall gain. A signal gain determining resistor which is ordinarily returned to a bypass capacitor is also returned to a biasing circuit that includes a current mirror having a single input and a pair of outputs. One of the current mirror outputs is coupled as a bias source to the amplifier and the other current mirror output is diode coupled to the first one. The current mirror is ratioed so that the sum of the two outputs equals the input. The current mirror input is biased at $2V_{BE}$ above ground and the input current is provided by a resistor coupled back to the supply and having a value equal to the amplifier feedback resistor. The current mirror outputs are connected to and supplied by means of a pair of current sources which have values close to the input transistor bias current. The current mirror output coupled only to the diode will act to switch the diode off and on as a function of $V_s$ and this operation will determine $V_T$ which is typically about 2.1 volts. Above this value the mirror diode will be nonconductive and a mirror ratio of 2:1 exists to force the bias to where the output voltage will track $V_s/2$. Below the threshold the diode will be on and the bias value will force an output of $V_s - K$ (where K is about 1.05 volts).

BRIEF DESCRIPTION OF THE DRAWING

FIG. 1 is a schematic diagram of the prior art circuit.

FIG. 2 ia a schematic diagram of the circuit of the invention.

FIG. 3 is a graph showing the performance of the circuit of FIG. 2.

DESCRIPTION OF THE INVENTION

FIG. 2 ia a schematic diagram of the circuit of the invention. Where the parts are similar, the FIG. 1 numbers are used. Block 25 represents an amplifier having a bootstrap output stage. Output terminal 13 will normally be coupled by conventional means to a loudspeaker or other transducer (not shown). Bootstrap terminal 26 is driven via bootstrap capacitor 27. Capacitor 27 is conventionally an off chip component using an IC amplifier design.

PNP transistor 30 has it base returned to ground by resistor 31. Its bias current $I_1$ is established at a low value by the input current of the next amplifier stage. The circuits are configured so that noninverting input terminal 14 drives the base of transistor 30 while inverting input terminal 15 drives the emitter to provide a differential input.

As was the case for FIG. 1, feedback resistor 16 establishes unity d-c gain for the circuit. Resistor 17, is signal bypassed to ground at pad 32 by capacitor 18, and determines the amplifier a-c gain.

Transistors 33, 34, and 35 form a current mirror responsive to $I_2$ flowing in resistor 36. Desirably transistor 33 has twice the area of transistors 34 and 35 so that combined conduction of transistors 34 and 35 equals $I_2$. Current sources 37 and 38 respectively feed $I_3$ and $I_4$ to transistors 34 and 35. Diode 39 is coupled to act as a swtich (as will be more fully explained hereinafter) between the two outputs of the current mirror. Diode connected transistor 40 develops one $V_{BE}$ at the base of transistor 41 as a result of $I_5$ flowing in source 42. Desirably the voltage across transistor 40 is can be controlled by the value of $I_5$ to approximate the $V_{BE}$ of transistor 30 which is about 525 mv at 300° K. Transistor 41 is connected to force transistor 33 to operate as a diode that is the current mirror input and is responsive to $I_2$.

The emitter of transistor 41 operates at $2V_{BE}$ above ground or at about 1.05 volt at 300° K. Thus the current $I_2$ flowing in resistor 36 is:

$$I_2 = \frac{V_S - V_{BE40} - V_{BE41}}{R_{36}} \qquad (1)$$

Where:

$R_{36}$ is the resistance of resistor 36 and the $V_{BE}$ values are related to those of transistors 40 and 41 as indicated.

This formula shows that above a $V_s$ of about 2 $V_{BE}$ $I_2$ will increase directly with $V_s$. Below a $V_s$ of about $2V_{BE}$ $I_2$ will rapidly drop to zero. $I_2$ is mirrored in transistor 34 as $I_2/2$ and when this value exceeds $I_3$ it will pull the collector of transistor 34 low and turn diode 39 off. This action determines $V_T$ which is determined experimentally for the amplifier being used. A value of 2.1 volts was selected for the circuit of FIG. 2. Above $V_T$ where diode 39 is off, the potential at terminal 13 will be equal to the voltage drop across resistor 16 plus the input offset voltage at the emitter of transistor 30 in accordance with the formula:

$$V_{13} = \frac{1}{2}(V_s - V_{BE40} - V_{BE41}) \cdot \frac{R_{16}}{R_{36}} + V_{BE30} + (I_1 - I_4)R_{16}$$

Where the first two terms represent a voltage across resistor 16 due to the current sunk out of mirror transistor 35 that will flow in resistor 16 and the last term is the difference between $I_1$ and $I_4$ that will also flow in resistor 16 to produce a voltage thereacross. If $I_4$ is made to match $I_1$ and if resistor 36 is made to match resistor 16, since $V_{BE30} \approx V_{BE40} \approx V_{BE41}$, the above formula will reduce to $V_{13} = \frac{1}{2}V_s$. The $\frac{1}{2}$ is due to the geometrical factor built into the current mirror.

When $V_s$ is below $V_T$, $I_3$ will dominate the current flowing in transistor 34 and pull its collector high so as to turn diode 39 on. This connects the collectors of transistors 34 and 35 together so that the current mirror has unity gain. Under this condition the potential at terminal 13 is:

$$V_{13} = (V_s - V_{BE40} - V_{BE41}) \cdot \frac{R_{16}}{R_{36}} + V_{BE30} + (I_1 - I_3 - I_4) \cdot R_{16}$$

Where the first terms represent the voltage across resistor 16 due to the current mirror current output flowing in resistor 16 and the last term is the voltage across resistor 16 due to the effects of $I_1$, $I_3$, and $I_4$ combined. Since $R_{16} \approx R_{36}$, and $I_1 \approx I_4$, where $I_3 \cdot R_{16}$ is made $\approx V_{BE30}$, the formula reduces to $V_{13} = V_s - K$ where K is $2V_{BE}$ or about 1.05 volt.

FIG. 3 is a graph that portrays the performance of the circuit of FIG. 2. Solid curve 44 shows the $V_{out} = V_s/2$ relationship for supply voltages above $V_T$ which is close to 2.1 volts. Below $V_T$ it can be seen that K is close to 1.05 volts so that a $V_s - 1.05$ relationship exists and the operating curve would extrapolate to zero at a $V_s$ of slightly over 1 volt.

EXAMPLE

The circuit of FIG. 2 was constructed using conventional junction isolated monolithic semiconductor IC components. The NPN devices were of conventional vertical construction and had current gain values in excess of 200. The PNP transistors were of conventional lateral construction and had current gain in excess of 100. Accordingly the transistor base currents were such a small fraction of their collector curents that in any first order approximations, the base currents can be neglected. The following circuit component values were employed:

| COMPONENT | VALUE | UNITS |
|---|---|---|
| Resistor 16 | 17.1K | Ohms |
| Resistor 17 | 35 | Ohms |
| Capacitor 18 | 10 | Microfarads |
| Capacitor 27 | 47 | Microfarads |
| Resistor 31 | 24K | Ohms |
| Resistor 36 | 17.1K | Ohms |
| Current Source 37 | 31 | Microamperes |
| Current Source 38 | 31 | Microamperes |
| Current Source 42 | 31 | Microamperes |

The amplifier had a signal gain of about 46 db and the voltage at terminal 13 followed the solid curve of FIG. 3 with a $V_T$ of 2.1 volts at 300° K. It was found that the best dynamic range occured for supply voltages above about 1.2 volts.

The circuit of the invention has been described and a working example detailed. When a person skilled in the art reads the above description there will occur alternatives and equivalents that are within the spirit and intent of the invention. Therefore, it is intended that the scope of the invention be limited only the the following claims.

We claim:

1. In an operational amplifier having inverting and noninverting imputs and that employs a bootstrapped power output stage and is designed to operate from a low source of supply voltage having one terminal grounded and operative to function over a wide range of supply voltage, circuit means for optimizing the output terminal quiescent voltage whereby above a threshold voltage limit, the output voltage is made equal to one-half of said supply voltage and below said threshold voltage limit the output voltage is made equal to said supply voltage less a fixed constant voltage thereby maximizing the dynamic range at all supply voltages, said circuit means comprising:

a current mirror having an input and first and second outputs;

means for coupling said input to a source of biasing current;

means for coupling the first of said outputs to the inverting input of said operational amplifier; and diode means coupled between said first and second outputs whereby said second output is coupled to said first output and whereby said diode means is turned on when said supply voltage is below said threshold voltage and turned off when said supply voltage is above said threshold voltage.

2. The circuit means of claim 1 wherein said current mirror input is obtained from a first resistor returned to said source of supply voltage whereby said current mirror receives an input current directly related to said supply voltage.

3. The circuit means of claim 2 wherein said operational amplifier includes a second resistor coupled between its output and its inverting input to establish unity d-c gain and said first and said second resistor values are matched.

4. The circuit means of claim 3 wherein said first and said second current mirror outputs are coupled respectively by means of first and second current sources to said source of supply voltage whereby said second current source determines said threshold voltage.

5. The circuit means of claim 4 wherein said operational amplifier has an input transistor wherein the base provides the noninverting input and the emitter provides the inverting input which has an input offset potential that places its inverting input one conducting transistor base to emitter voltage drop above the noninverting input.

6. The circuit means of claim 4 wherein the current in said first current source is made close to the input current of said operational amplifier and the combined currents of said first and second current sources when multiplied by the value of said second resistor produces a voltage of close to said offset potential whereby amplifier is operative at a supply level in excess of about one volt at about 300° K.

* * * * *